(12) United States Patent
Morii et al.

(10) Patent No.: US 6,916,506 B2
(45) Date of Patent: Jul. 12, 2005

(54) METHOD FOR FORMING THIN FILM AND METHOD FOR FORMING ELECTRONIC DEVICE

(75) Inventors: Katsuyuki Morii, Suwa (JP); Hiroshi Takiguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 105 days.

(21) Appl. No.: 10/267,638

(22) Filed: Oct. 10, 2002

(65) Prior Publication Data

US 2003/0082858 A1 May 1, 2003

(30) Foreign Application Priority Data

Oct. 10, 2001 (JP) ........................................ 2001-313227
Sep. 12, 2002 (JP) ........................................ 2002-266958

(51) Int. Cl.$^7$ ................................................ B05D 1/36
(52) U.S. Cl. ...................... 427/407.1; 427/58; 427/258; 427/372.2; 427/402
(58) Field of Search ................................ 427/299, 327, 427/372.2, 402, 407.1, 58, 258

(56) References Cited

U.S. PATENT DOCUMENTS 5,728,431 A * 3/1998 Bergbreiter et al. ..... 427/388.1
5,885,753 A * 3/1999 Crooks et al. ............. 430/325
5,900,160 A * 5/1999 Whitesides et al. ........ 216/41

FOREIGN PATENT DOCUMENTS

| EP | 1 028 136 A2 * | 2/2000 |
| JP | A 11-40358 | 2/1999 |
| JP | A 11-54272 | 2/1999 |
| JP | 11-054272 A * | 2/1999 |
| WO | WO 95/02251 A2 * | 1/1995 |
| WO | WO 99/26729 A1 * | 6/1999 |

OTHER PUBLICATIONS

Definition of "pattern" from The American Heritage Dictionary of the English Language, 4th Edition,Copyright 2000 by Houghton Mifflin Company, as posted at http://www-.bartleby.com/61/86/P01186000.html on Sep. 8, 2004.*

A. Ulman, "An Introduction to Ultrathin Organic Film From Langmuir–Blodgett to Self–Assembly" Chapter 3, Academic Press, Inc., Boston, 1991.

* cited by examiner

Primary Examiner—Timothy Meeks
Assistant Examiner—William Phillip Fletcher, III
(74) Attorney, Agent, or Firm—Oliff & Berridge PLC

(57) ABSTRACT

The invention provides thin films of low molecular compounds. A thin-film forming area on a surface of a silicon substrate is allowed to have high affinity for a thin-film forming material. For this purpose, a self-assembled film having an atomic group in common with a molecule constituting the thin-film forming material is formed in the thin-film forming area. Thereafter, a solution is discharged to the surface of the silicon substrate by an ink jet process.

17 Claims, 3 Drawing Sheets

(a)

(b)

(c)

METHOD FOR FORMING THIN FILM AND METHOD FOR FORMING ELECTRONIC DEVICE

BACKGROUND OF THE INVENTION

1. Field of Invention

The present invention relates to a method for forming a thin film which includes: discharging a solution containing a thin-film forming material dissolved in a solvent to thereby apply a droplet of the solution to a substrate, and evaporating the solvent from the droplet to thereby form a thin film on the substrate.

2. Description of Related Art

Related art thin films formed by an ink-jet process are thin films made from polymeric compounds. Such thin films made from polymeric compounds can be easily formed by applying a solution containing a polymeric compound dissolved in a solvent to a substrate and evaporating the solvent from the applied solution.

Relating art thin film forming methods are disclosed in: Japanese Unexamined Patent Application Publication No. 11-40358; and Japanese Unexamined Patent Application Publication No. 11-54272.

SUMMARY OF THE INVENTION

However, if a compound, which has a low molecular weight and is not categorized as a polymeric compound (hereinafter "low molecular compound"), is used for the formation of a thin film according to the same procedure as in the polymeric compounds, a thin film of the low molecular compound is not formed but particles of the low molecular compound are deposited on a substrate.

This is because the cohesive strength between molecules of the low molecular compound is much larger than the bonding strength between the low molecular compound and the substrate even if the substrate, is treated to have lyophilicity. Such low molecular compounds can also refer to highly crystalline materials due to their high cohesive strength, and their high crystallinity yields great advantages in their functions, such as conductivity. Accordingly, techniques for forming films from such low molecular compounds have been sought.

Functional thin films are patterned and used in many electron devices. However, even if crystalline organic thin films are formed by, for example, vacuum deposition, the film forming process requires specific conditions or is limited in materials to be used. In addition, the organic thin films are low in resist resistance and cannot significantly be formed according to regular patterning processes including photolithography and etching.

On the other hand, if crystalline thin films can be formed by an ink jet process, patternwise crystalline organic thin films can be easily formed in contrast to conventional technologies.

Accordingly, the present invention forms thin films of low molecular compounds and forms patternwise crystalline thin films, particularly organic thin films, by an ink jet process easily.

To address or solve the above problems, the present invention provides a method for forming a thin film, including: discharging a solution containing a thin-film forming material dissolved in a solvent to thereby apply a droplet of the solution to a substrate, and evaporating the solvent from the droplet to thereby form a thin film on the substrate, in which the substrate is subjected to a treatment to have a surface with affinity for the thin-film forming material, and the solution is then discharged.

According to this method, when the solution is discharged by, for example, an ink jet process, the thin-film forming material dissolved in the discharged solution remains on the substrate having a surface with affinity for the thin-film forming material. By this configuration, the bonding strength between the thin-film forming material and the substrate becomes higher than the cohesive strength between the material molecules even if the thin-film forming material is a low molecular compound, and a thin film can be formed by, for example, an ink jet process.

To enable the substrate to have a surface with affinity for the thin-film forming material, the formation of a self-assembled film on the substrate is preferably employed.

The term "self-assembled film" as used herein means a monomolecular film which is obtained by allowing a compound having a functional group that can be combined with the constitutive atom of a surface on which the film is formed to become in the state of gas or liquid and coexistent with the surface on which the film is formed. In the monomolecular film, the functional group is adsorbed by the film-forming surface and combines with the constitutive atom of the film-forming surface, and a straight-chain molecule faces the outside. This monomolecular film is called a self-assembled film, since it is formed by spontaneous chemical adsorption of the compound to the film-forming surface.

In this connection, the self-assembled film is described in detail in A. Ulman, Chapter 3, "An Introduction to Ultrathin Organic Film From Langmuir-Blodgett to Self-Assembly" (Academic Press Inc., Boston, 1991).

The process for controlling the surface of the substrate by the formation of such a self-assembled film is one of processes to ensure electrical continuity between the substrate and functional thin films of electron devices when thin films formed according to the method of the present invention are used as the functional thin films.

To allow the substrate to have a surface with affinity for the thin-film forming material by the formation of a self-assembled film, for example, a self-assembled film including a molecule having an atomic group in common with a molecule constituting the thin-film forming material is formed on the substrate.

Thin-film forming materials that can be used in the method of the present invention include oligophenylenes and derivatives thereof or oligothiophenes and derivatives thereof. The oligothiophenes are represented by following Formula (1), and the oligothiophenes are represented by following Formula (2), n is equal to or more than 2, and is preferably equal to or more than 2 and less than or equal to 6, in each formula.

[Chemical Formula 1]

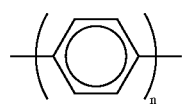

(1)

-continued

[Chemical Formula 2]

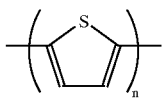

(2)

Examples of the oligophenylenes include p-terphenyl represented by following Formula (3), and examples of the oligothiophenes include terthiophene represented by following Formula (4). The derivatives of oligophenylenes include, for example, 4-amino-p-terphenyl represented by following Formula (5), and the derivatives of oligothiophenes include, for example, 2,2':5',2"-terthiophene-5,5"-dicarboxaldehyde represented by following Formula (6).

[Chemical Formula 3]

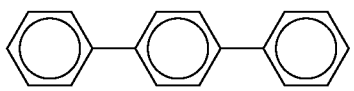

(3)

[Chemical Formula 4]

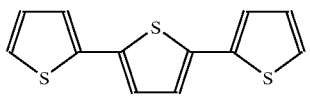

(4)

[Chemical Formula 5]

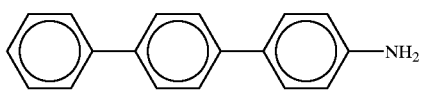

(5)

[Chemical Formula 6]

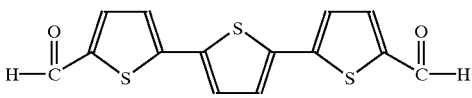

(6)

When the thin-film forming material is an oligophenylene or a derivative thereof, a self-assembled film including a molecule having, for example, a benzene ring at its end is formed on the substrate. When the thin-film forming material is an oligothiophene or a derivative thereof, a self-assembled film including a molecule having, for example, a thiophene ring at its end is formed on the substrate.

The present invention also provides a method for forming a thin film, including: discharging a solution containing a thin-film forming material dissolved in a solvent to thereby apply a droplet of the solution to a substrate, and evaporating the solvent from the droplet to thereby form a thin film on the substrate, in which a first area (an area corresponding to an area in which a thin film is formed), and a second area are formed on the substrate. The first area has a surface with high affinity for the thin-film forming material, and the second area has a surface with low affinity for the thin-film forming material. The solution is discharged so as to form a droplet on the first area to cover the overall first area.

In this method, for example, the first area having a surface with high affinity for the thin-film forming material is formed in a predetermined pattern on the substrate, and the other area on the substrate is defined as the second area having a surface with low affinity for the thin-film forming material, and the solution is then discharged.

When a plurality of the first areas are formed on the substrate, the solution is discharged so as to form a droplet on each area to cover the overall area in question.

According to this method, when the solution is discharged by, for example, an ink jet process, the thin-film forming material dissolved in the discharged solution remains in the first area on the substrate having a surface with affinity for the thin-film forming material, and does not exist in the second area on the substrate even when the droplet extends and is formed also on the second area having a surface with low affinity for the thin-film forming material.

In the first area, the bonding strength between the thin-film forming material and the substrate therefore becomes higher than the cohesive strength between the material molecules to thereby form a thin film when the thin-film forming material is a low molecular compound. In the second area, however, the thin-film forming material does not exist, and particles made from the thin-film forming material are not deposited. As a result, a thin film in the same pattern with the first area is formed on the substrate.

In the above method, the difference of the affinity of the solution for the first area and for the second area is preferably such that the difference in contact angle is less than or equal to 10 degrees.

In the method, it is preferred that a first self-assembled film is formed on a substrate to thereby form the first area. The self-assembled film includes a molecule having an atomic group in common with a molecule constituting the thin-film forming material. A second self-assembled film is formed on the substrate to thereby form the second area. The second self-assembled film comprises a molecule different from that of the first self-assembled film (e.g., a molecule having no atomic group in common with the molecule constituting the thin-film forming material).

In addition, the present invention provides a method for forming an electronic device including: forming a thin film according to the method of the present invention.

DETAILED DESCRIPTION OF PREFERRED EMBODIMENTS

Figure 1:
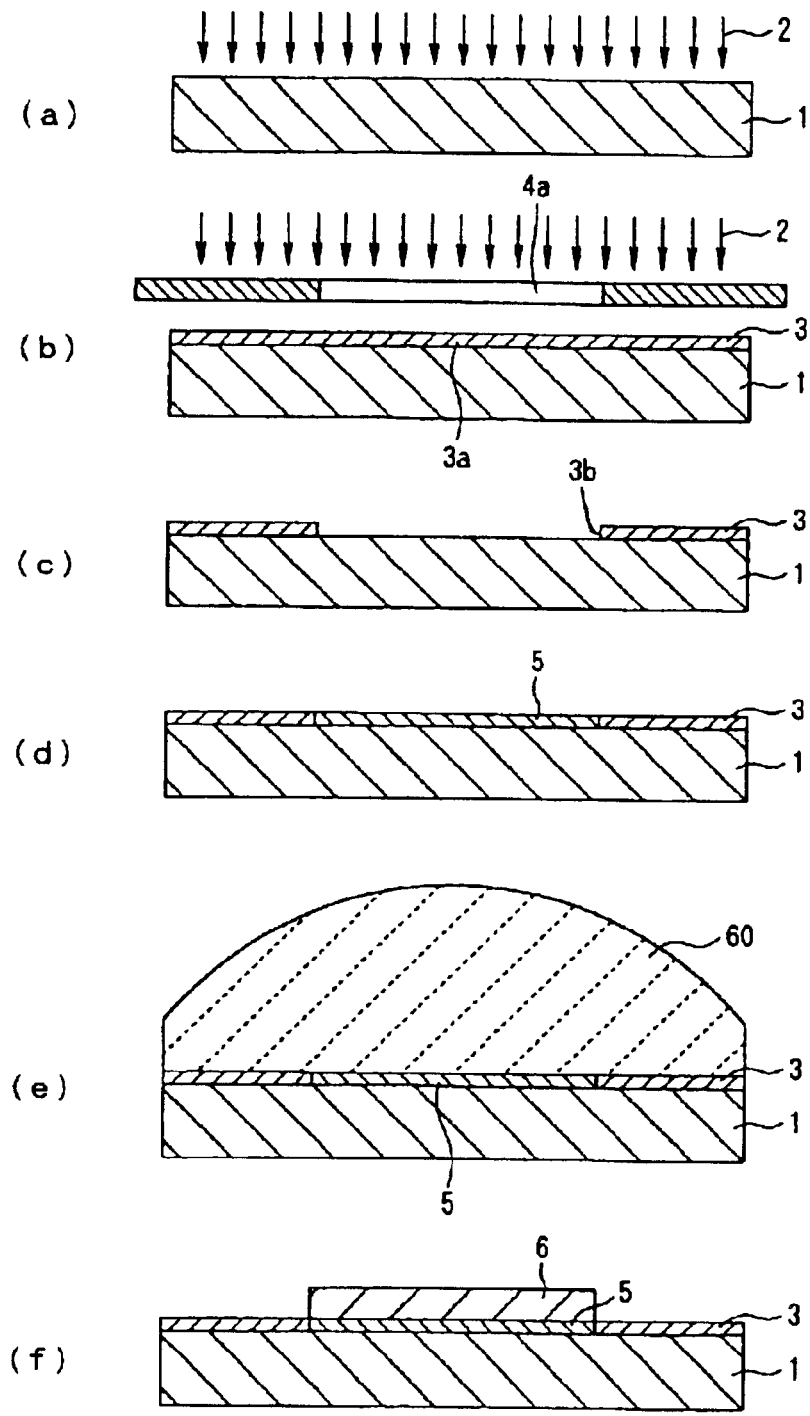
FIGS. 1(a)–1(f) are sectional views illustrating steps performed in the embodiments of the present invention.

The present invention will be further illustrated with reference to several embodiments below.

<First Embodiment>

In the present embodiment, a method for forming a thin film of p-terphenyl by an ink jet process is illustrated, in which a solution of p-terphenyl represented by Chemical Formula (3) (thin-film forming material) in 2,3-dihydrobenzofuran is used. FIGS. 1(a)–1(f) are sectional views showing steps performed in the method.

Initially, with reference to FIG. 1(a), ultraviolet rays 2 with a wavelength of 172 nm were applied to a surface of a silicon substrate 1 to thereby make the surface of the silicon substrate 1 hydrophilic.

[Chemical Formula 7]

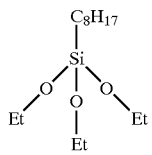

(7)

Next, liquid octyltriethoxysilane represented by above Formula (7) was placed in a vessel with no lid, and the vessel and the silicon substrate 1 were placed in an enclosed space and were allowed to stand for 1 hour while maintaining the inside temperature of the space at 120° C.

By this procedure, a hydroxyl group on the surface of the silicon substrate 1 reacted with an ethoxy group of octyltriethoxysilane to thereby form a bond between the oxygen atom of the ethoxy group and the silicon substrate 1. As a result, a self-assembled film having an octyl group on its surface (a second self-assembled film including a molecule having no atomic group in common with the molecule constituting p-terphenyl) 3 was formed on the overall surface of the silicon substrate 1.

Next, with reference to FIG. 1(b), ultraviolet rays with a wavelength of 172 nm were applied to the second self-assembled film 3 through a photomask 4 having a light-transmitting portion 4a corresponding to the thin-film forming area (a circle having a diameter of 20 µm). By this procedure, a potion 3a of the second self-assembled film 3 corresponding to the thin-film forming area was decomposed.

Next, the portion 3a of the second self-assembled film 3 was removed by washing the silicon substrate 1 with ethanol. By this procedure, the portion of the second self-assembled film 3 corresponding to the circular thin-film forming area became a circular opening 3b, and the surface of the substrate in the opening 3b was exposed as shown in FIG. 1(c).

[Chemical Formula 8]

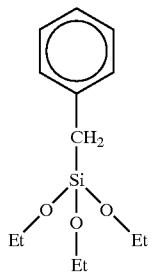

(8)

Next, a liquid benzyltriethoxysilane represented by above Formula (8) was placed in a vessel with no lid, and the vessel and the silicon substrate 1 were placed in an enclosed space and were allowed to stand for 1 hour while maintaining the inside temperature of the space at 120° C. Next, the overall surface of the substrate 1 was washed with ethanol.

By this procedure, a hydroxyl group on the surface of the silicon substrate 1 exposed to the opening 3b reacted with an ethoxy group of benzyltriethoxysilane to form a bonding between the oxygen atom of the ethoxy group and the silicon substrate 1. As a result, a first self-assembled film having a benzyl group on its surface (a self-assembled film including a molecule having a benzene ring, namely an atomic group in common with a molecule constituting p-terphenyl) 5 was formed in the circular opening 3b of the second self-assembled film 3.

Figure 2:
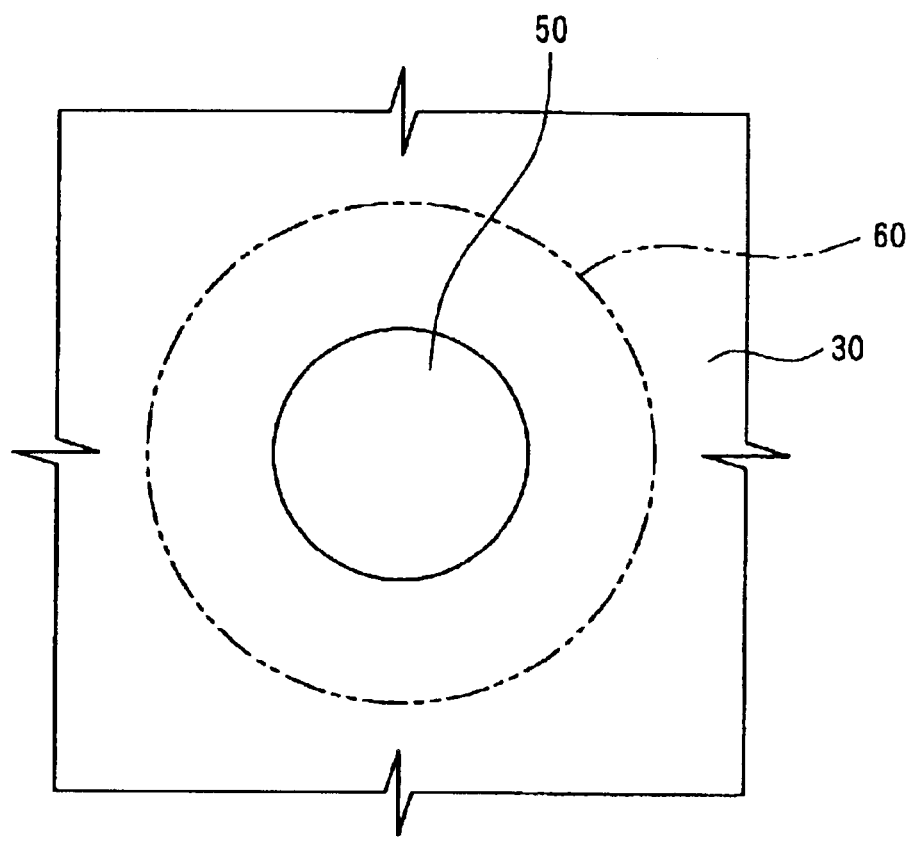
FIG. 2 is a plan view illustrating the states in FIGS. 1(d) and 1(e)

FIG. 1(d) and FIG. 2 are a sectional view and a plan view, respectively, illustrating this state. With reference to FIGS. 1(d) and 2, by the above steps, a first area (an area in which the first self-assembled film 5 was formed) 50 having a surface with high affinity for p-terphenyl (thin-film forming material) was formed in a circular pattern on the silicon substrate 1, and the other area on the silicon substrate 1 than the first area constituted a second area (an area in which the second self-assembled film 3 was formed) 30 having a surface with low affinity for p-terphenyl.

Subsequently, p-terphenyl (thin-film forming material) was dissolved in 2,3-dihydrobenzofuran (solvent) to a concentration of 0.1% by weight and thereby yielded a solution. The solution was placed in a head of an ink jet apparatus and was discharged in an amount of 20 picoliters per droplet to the surface of the silicon substrate 1 in the state shown in FIG. 1(d). The discharge procedure was performed in such a manner that the center of a circle constituting the first self-assembled film 5 coincided with the nozzle position of the head.

By this procedure, a droplet 60 including the solution was applied onto the silicon substrate 1 at the bottom of a circle (40 µm) lager than the first area 50 comprising the first self-assembled film 5, as indicated by the chain double-dashed line in FIG. 2. Specifically, the droplet 60 was formed so as to cover the overall first area 50 and extend to the second area 30. FIG. 1(e) illustrates this state.

Next, the solvent was evaporated from the droplet 60 by leaving stand at this state, and a p-terphenyl thin film 6 was formed on the silicon substrate 1 only in a region carrying the first self-assembled film 5 formed thereon, as shown in FIG. 1(f). Namely, the p-terphenyl thin film 6 in the same circular form as in the first self-assembled film 5 was formed. However, the above-prepared p-terphenyl thin film 6 was not a crystalline thin film and instead was an amorphous thin film.

<Second Embodiment>

To form a crystalline thin film by an ink jet process, the following procedures are required. Namely, the solution constituting the applied droplet is made supersaturated and the partial pressure of a gas having the same composition with the solvent in the vicinity of the droplet is controlled to a first partial pressure at which the solvent hardly vaporizes from the solution constituting the droplet (e.g., the same or nearly the same partial pressure with the saturated vapor pressure), and thereby a crystal nucleus is formed. The partial pressure of the gas in the vicinity of the droplet is then decreased to a second partial pressure (e.g., one tenth to one hundredth the saturated vapor pressure) at which crystal growth of the crystal nucleus occurs prior to the formation of other crystal nuclei. The method for forming a crystalline thin film by the ink jet process is illustrated below.

According to the method for forming a crystalline thin film just mentioned above, the solution constituting the droplet is made supersaturated immediately after the application to the substrate, and a crystal nucleus necessary for the crystallization is thereby formed in the solution. Next, the partial pressure of the gas (the gas having the same composition with the solvent) in the vicinity of the droplet is reduced from the first partial pressure (a high pressure at which the solvent hardly vaporizes from the solution constituting the droplet) to the second partial pressure (crystal growth of the crystal nucleus already formed occurs prior to the formation of other crystal nuclei), and thereby a crystal begins to grow.

According to this method, therefore, a patternwise crystalline thin film can be easily formed on the substrate by, for example, applying the droplet in a predetermined pattern by the ink jet process.

If the volume of the droplet applied to the substrate is very small, for example, 20 picoliters as in the case where the step of applying a droplet is performed by the ink jet process, and if the partial pressure of the gas (the gas having the same composition with the solvent of the solution constituting the droplet) in the vicinity of the droplet is low, the solvent easily evaporates from the droplet. Accordingly, the concentration of the solution constituting the droplet rapidly increases and the degree of supersaturation of the solution steeply increases to yield a multitude of crystal nuclei to thereby make the solute powdered. In contrast, according to the method for forming a crystalline thin film, the partial pressure of the gas in the vicinity of the droplet immediately after the application of the droplet is controlled at the first partial pressure (a partial pressure at which the solvent hardly vaporizes from the solution constituting the droplet), and thereby the solution constituting the droplet is stabilized under supersaturation conditions with a relatively low degree of supersaturation, namely an increase of the degree of supersaturation of the solution constituting the droplet becomes lowered. Accordingly, a few (ideally one) nuclei are formed.

To form a singlecrystalline thin film, it is required that only one nucleus formed be allowed to grow and other nuclei should be prevented from forming. If the partial pressure of the gas in the vicinity of the droplet remains high immediately after the application of the droplet, other nuclei are formed. In contrast, according to the method for forming a crystalline thin film, the partial pressure after the formation of the crystal nucleus is decreased to a partial pressure at which crystal growth of the crystal nucleus occurs prior to the formation of other crystal nuclei (the second partial pressure). By this procedure, the crystal growth is accelerated while avoiding the further formation of other nuclei.

Consequently, a singlecrystalline thin film can be obtained according to the method for forming a crystalline thin film in the following manner. Specifically, the partial pressure is steeply decreased from the first partial pressure to the second partial pressure immediately after a few (ideally one) nuclei are formed in the solution, and thereby the degree of supersaturation of the solution constituting the droplet is steeply increased to yield a singlecrystalline thin film. For example, the partial pressure at the first partial pressure of equal to, or nearly equal to, the saturated vapor pressure is decreased to the second partial pressure of 1.3 Pa ($10^{-2}$ Torr) within 1 to 10 seconds.

To perform the method for forming a crystalline thin film, the method of the present invention is preferably employed, in which the solution is discharged after the substrate has a surface with affinity for the thin-film forming material. By applying this method, the material low molecular compound with high crystallinity coheres stably on the substrate, and a crystalline thin film can be formed more stably.

In addition, a patternwise crystalline thin film can be easily formed on the substrate according to the method for forming a crystalline thin film by discharging the solution in a predetermined pattern by the ink jet process.

In this procedure, the method of the present invention is preferably employed, in which the first area (an area corresponding to a thin film forming area), having a surface with high affinity for the thin-film forming material, is formed in a predetermined pattern on the substrate, and the other area on the substrate is defined as the second area having a surface with low affinity for the thin-film forming material, and the solution is then discharged so as to form a droplet to cover the overall first area. By employing this method, the material low molecular compound with high crystallinity only coheres stably in the film forming area, and the target crystalline thin film can be formed more stably at a predetermined position on the substrate corresponding to the pattern.

Processes for controlling the partial pressure to a higher partial pressure in the method for forming a crystalline thin film include: (1) controlling discharge interval of the droplets, (2) controlling the discharge amount of the solution, and (3) controlling the partial pressure of the gas at the position where the droplet is to be applied before the step of applying the droplet.

Processes for relatively reducing the partial pressure in the method for forming crystalline thin film include: (1) reducing the pressure of an atmosphere in the vicinity of the droplet, (2) elevating a temperature in the vicinity of the droplet, and (3) replacing the atmosphere in the vicinity of the droplet with an atmosphere of an inert gas.

Preferred solutions for use in the method for forming a crystalline thin film are: (1) a solution containing the thin-film forming material in such an amount as to become saturated upon discharge, (2) a solution containing the thin-film forming material in such an amount that the concentration upon discharge becomes equal to or more than one tenth the saturated concentration and less than the saturated concentration, and (3) a solution containing the thin-film forming material in such an amount that the solution becomes supersaturated upon discharge. By this configuration, the solution constituting the droplet applied onto the substrate becomes supersaturated more easily immediately after the discharge by the ink jet process, and the crystal nucleus can be formed more reliably.

The second embodiment is an embodiment in which the method of the present invention is applied to the method for forming a crystalline thin film.

Initially, the process steps of FIGS. 1(a)–1(d) were performed in the same manner as in the first embodiment, except the first self-assembled film 5 was formed in a pattern in which a multitude of circles 20 $\mu$m in diameter were arranged with 210-$\mu$m pitches.

Next, the silicon substrate 1 at the state shown in FIG. 1(d) was placed in an enclosed space with a vacuum pump, the inside of the enclosed space was held at 25° C., and the same solution as in the first embodiment was discharged to the surface of the substrate in an amount of 20 picoliters per droplet using an ink jet apparatus "MJ-930C" manufactured by Seiko Epson Corporation.

In this connection, the saturated concentration of p-terphenyl in 2,3-dihydrobenzofuran at 25° C. is 1.0% by weight, and the concentration of p-terphenyl in the solution just mentioned above was one tenth the saturated concentration upon discharge.

A head with one nozzle was used as the head of the ink jet apparatus. The atmosphere inside the enclosed space was air at atmospheric pressure. The discharge procedure of the solution was repeated ten times while the head was moved with intervals of 210 $\mu$m along one side of the substrate.

In the discharge procedure, the centers of the circles constituting the first self-assembled film 5 were made coincident with the nozzle position of the head. The distance between the head nozzle and the substrate was set at 1 mm.

By this procedure, ten droplets 60 were formed on the silicon substrate 1 with 210-μm pitches in a straight line. This state is the same with that in FIG. 1(e) in the first embodiment.

Concurrently with the completion of the formation of droplets, the vacuum pump was brought into operation to reduce the inside pressure of the enclosed space to 1.3 Pa ($10^{-2}$ Torr), and this condition was maintained for six hours. Six hours later, the silicon substrate 1 was taken out from the enclosed space and was found to have a circular p-terphenyl thin film 20 μm in diameter and 0.1 μm in thickness only in portions on the silicon substrate 1 where the first self-assembled film 5 was formed, as shown in FIG. 1(f). Namely, the p-terphenyl thin film was formed on the substrate in the same pattern with the first self-assembled film 5. The p-terphenyl thin film was nearly singlecrystalline.

The p-terphenyl monocrystalline thin film is a functional thin film that can be advantageously used as a semiconductor film for various electron devices.

It is speculated that few nuclei are formed according to the present embodiment in the following manner. Specifically, the concentration of the solution upon discharge is one tenth the saturated concentration, and the solution constituting the droplet readily becomes supersaturated immediately after the application of the droplet to the substrate. In addition, the discharge amount per droplet is set at 20 picoliters, and the droplets are formed with 210-μm pitches. By these configurations, the partial pressure of a gas including 2,3-dihydrobenzofuran (the same composition with the solvent) in the vicinity of the droplet immediately after the application becomes a high partial pressure at which 2,3-dihydrobenzofuran (solvent) hardly vaporizes from the solution constituting the droplet. For these reasons, the solution constituting the droplet is stabilized in supersaturated state with a relatively low degree of supersaturation and few nuclei are formed.

The crystal growth is accelerated probably for the following reasons. Specifically, the pressure inside the enclosed space starts to decrease concurrently with the completion of the formation of droplet, and thereby the partial pressure of the solvent vapor in the vicinity of the droplet steeply decreases and the degree of supersaturation of the solution constituting the droplet steeply increases at the time when a few crystal nuclei are formed. Under this condition, the crystal growth occurs prior to the formation of other crystal nuclei. By holding this reduced pressure condition for six hours, the crystal growth is accelerated.

The present embodiment uses p-terphenyl as the thin-film forming material, 2,3-dihydrobenzofuran as the solvent, benzyltriethoxysilane as the first self-assembled film to allow the substrate to have a surface with high affinity (having affinity) for p-terphenyl, and octyltriethoxysilane as the second self-assembled film to allow the substrate to have a surface with low affinity (having no affinity) for p-terphenyl. However, instead of benzyltriethoxysilane, compounds corresponding to benzyltriethoxysilane except with a naphthalene ring or the like replacing the benzene ring, and compounds corresponding to benzyltriethoxysilane except with another alkylene group replacing the methylene group of the benzyl moiety, can be used, for example.

<Third Embodiment>

The third embodiment is also an embodiment in which the method of the present invention is applied to the method for forming a crystalline thin film, as in the second embodiment.

Initially, 4-amino-p-terphenyl (thin-film forming material) having a structure represented by Chemical Formula (5) was dissolved in dimethylformamide (solvent) to a concentration of 1.0% by weight and thereby yielded a solution. The saturated concentration of 4-amino-p-terphenyl in dimethylformamide at 25° C. (the temperature upon discharge of the solution) is 1.0% by weight, and the solution becomes saturated with 4-amino-p-terphenyl upon discharge.

The procedure of the second embodiment was repeated, except that the above solution was used. As a result, the silicon substrate 1 taken out from the enclosed space six hours later was found to have a circular 4-amino-p-terphenyl thin film 20 μm in diameter and 0.1 μm in thickness only in portions on the silicon substrate 1 where the first self-assembled film 5 was formed, as shown in FIG. 1F. Namely, the 4-amino-p-terphenyl thin film was formed on the substrate in the same pattern with the first self-assembled film 5. The 4-amino-p-terphenyl thin film was nearly monocrystalline. The 4-amino-p-terphenyl crystalline thin film is a functional thin film that can be advantageously used as a semiconductor film for various electron devices.

<Fourth Embodiment>

The fourth embodiment is also an embodiment in which the method of the present invention is applied to the method of forming a crystalline thin film, as in the second embodiment.

Initially, a terthiophene having a structure represented by Chemical Formula (4) (2,2':5',2"-terthiophene, thin-film forming material) was dissolved in dodecylbenzene (solvent) to a concentration of 1.0% by weight. The saturated concentration of the terthiophene in dodecylbenzene at 25° C. (the temperature upon discharge of the solution) is 1.0% by weight. Accordingly, the solution becomes saturated with terthiophene upon discharge.

The procedure of the second embodiment was repeated, except that the above solution and a substrate carrying gold on its surface were used and that liquid 2,2':5',2":5",2'":-quaterthiophene-5",5'"-diylbis(phosphoric acid) represented by the following Formula (9) was used instead of benzyltriethoxysilane in the formation of the first self-assembled film 5.

[Chemical Formula (9)]

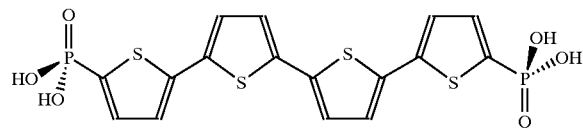

(9)

As a result, the silicon substrate 1 taken out from the enclosed space six hours later was found to have a circular terthiophene thin film 20 μm in diameter and 0.1 μm in thickness only in portions on the silicon substrate 1 where the first self-assembled film 5 was formed, as shown in FIG. 1(f). Namely, the terthiophene thin film was formed on the substrate in the same pattern with the first self-assembled film 5. The terthiophene thin film was nearly singlecrystalline. The terthiophene crystalline thin film is a functional thin film that can be advantageously used as a semiconductor film for various electron devices. In addition, such oligothiophene singlecrystalline thin films can be advantageously used as functional films constituting organic TFTs (thin film transistors).

<Fifth Embodiment>

The fifth embodiment is also an embodiment in which the method of the present invention is applied to the method for forming a crystalline thin film, as in the second embodiment.

Initially, 2,2':5',2"-terthiophene-5,5"-dicarboxaldehyde (a terthiophene derivative, thin-film forming material) having a structure represented by Chemical Formula (6) was dissolved in dimethylformamide (solvent) to a concentration of 1.0% by weight and thereby yielded a solution. The saturated concentration of the derivative in dimethylformamide at 25° C. (the temperature upon discharge of the solution) is 1.0% by weight. Accordingly, the solution becomes saturated with the derivative upon discharge.

The procedure of the fourth embodiment was repeated, except using the above-prepared solution.

As a result, the silicon substrate 1 taken out from the enclosed space six hours later was found to have a circular 2,2':5',2"-terthiophene-5,5"-dicarboxaldehyde thin film 20 µm in diameter and 0.1 µm in thickness only in portions on the silicon substrate 1 where the first self-assembled film 5 was formed, as shown in FIG. 1(*f*). Namely, the 2,2':5',2"-terthiophene-5,5"-dicarboxaldehyde thin film was formed on the substrate in the same pattern with the first self-assembled film 5. The 2,2':5',2"-terthiophene-5,5"-dicarboxaldehyde thin film was nearly singlecrystalline. The 2,2':5',2"-terthiophene-5,5"-dicarboxaldehyde crystalline thin film is a functional thin film that can be advantageously used as a semiconductor film for various electron devices.

Crystalline thin films formed by the formation method of the present invention can be advantageously used as semiconductor films for use in various electronic devices, such as light-emitting layers, and hole injection/transport layers and election injection/transport layers in organic electroluminescence (EL), diodes, capacitors, and transistors. Display devices including such electronic devices incorporating thin films formed by the method of the present invention include, for example, liquid crystal display devices and EL display devices. These display devices can be applied to, for example, electronic equipment, as shown in FIGS. 3(*a*)–3(*c*).

Figure 3:
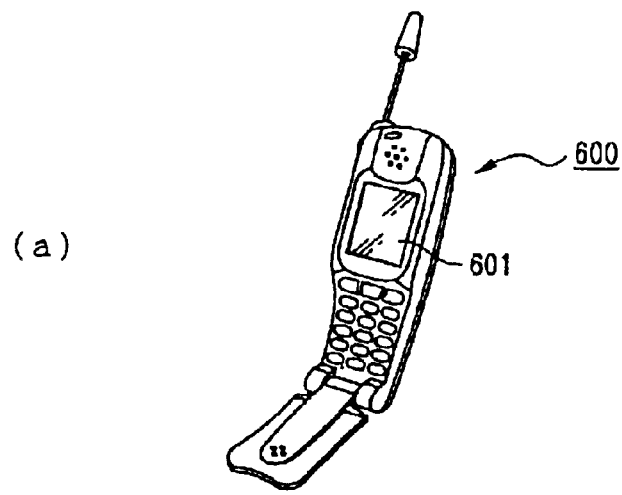
FIGS. 3(a)–3(c) are perspective views each illustrating an example of electronic equipment including a display device having an electronic device incorporating a thin film formed by the method of the present invention.
Figure 3:
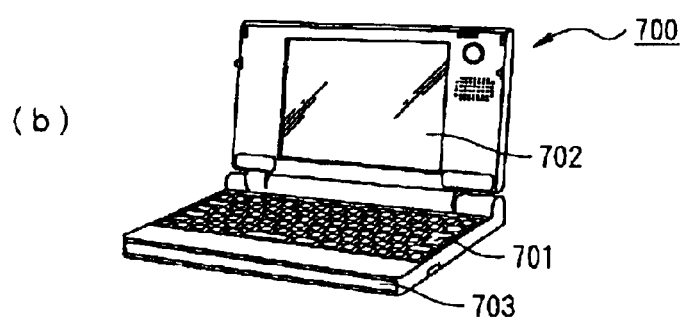
Figure 3:
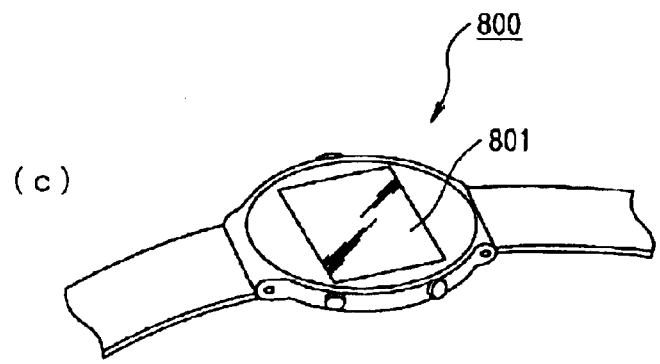

FIG. 3(*a*) is a perspective view of an example of a mobile phone. In FIG. 3(*a*), a main body 600 of the mobile phone includes a display unit 601 using the display device.

FIG. 3(*b*) is a perspective view of an example of a portable information processing device, such as word processors and personal computers. In FIG. 3(*b*), an information processing device 700 includes an input unit 701, such as a key board, an information processing main body 703, and a display unit 702 using the display device.

FIG. 3(*c*) is a perspective view of an example of wristwatch-type electronic equipment. In FIG. 3(*c*), a watch main body 800 includes a display unit 801 using the display device.

Each of the electronic equipment shown in FIGS. 3(*a*)–3(*c*) includes a display device including an electronic device as a display unit. The electronic device uses the crystalline thin film formed by the method of the embodiment as a semiconductor film. The electronic equipment therefore includes features of the method for forming a thin film of the present invention. According to the method for forming a thin film of the present invention, the electronic equipment can be easily produced.

[Advantages]

According to the method of the present invention as described above, thin films of low molecular compounds can be formed.

By applying the method of the present invention to the method for forming a patternwise crystalline thin film by, for example, an ink jet process, crystalline thin films can be more stably formed at a predetermined position on a substrate corresponding to a pattern. As a result, patternwise crystalline thin films can be easily formed.

What is claimed is:

1. A method for forming a film, comprising:
    subjecting a substrate to a treatment to have a surface pattern with affinity for p-terphenyl;
    discharging a solution containing a film forming material including at least p-terohenyl, dissolved in a solvent to thereby apply a droplet of the solution to the substrate; and
    evaporating the solvent from the droplet to thereby form a film pattern on the substrate conforming to the treated surface pattern.

2. The method for forming a film according to claim 1, further including forming a self-assembled film on the substrate to thereby enable the substrate to have a surface with affinity for the film forming material.

3. The method for forming a film according to claim 2, further including forming the self-assembled film with a molecule that has an atomic group in common with a molecule constituting the film forming material.

4. The method for forming a film according to claim 3, further including: forming the film forming material with an oligophenylene or a derivative thereof, and forming the self-assembled film with a molecule that has a phenyl or phenylene group at its end or in part.

5. A method for forming a film, comprising:
    forming a first area and a second area of a surface on a substrate, the first area of the surface having a high affinity for an oligophenylene or a derivative thereof, and the second area of the surface having a low affinity for the oligophenylene or the derivative thereof;
    discharging a solution containing a film forming material including at least oligophenylene or a derivative thereof, dissolved in a solvent to thereby apply a droplet of the solution to the surface of the substrate so as to form a droplet to cover the overall first area; and
    evaporating the solvent from the droplet to thereby form a film on the first area of the substrate as affected by the high affinity of the first area for the film forming material.

6. The method for forming a film according to claim 5, forming the first area and the second area including forming the first area of the surface having a high affinity for p-terphenyl, and the second area of the surface having a low affinity for p-terphenyl.

7. The method for forming a film according to claim 5, further including: forming a first self-assembled film on the substrate to thereby form the first area, the first self-assembled film including a molecule having an atomic group in common with the molecule constituting the film forming material, and
    forming a second self-assembled film on the substrate to thereby form the second area, the second self-assembled film including a molecule different from that of the first self-assembled film.

8. A method for forming an electronic device, comprising:
    forming a film according to the method of claim 5.

9. The method for forming a film according to claim 5, further comprising forming a self-assembled film on the substrate to thereby enable the substrate to have a surface with affinity for the film forming material.

10. The method for forming a film according to claim 9, further comprising forming the self-assembled film with a molecule that has an atomic group in common with a molecule constituting the film forming material.

11. The method for forming a film according to claim 10, further comprising: forming the film forming material with an oligophenylene or a derivative thereof, and forming the self-assembled film with a molecule that has a phenyl or phenylene group at its end or in part.

12. A method for forming a film, comprising:

forming a first area and a second area of a surface on a substrate, the first area of the surface having a high affinity for oligothiophene or a derivative thereof, and the second area of the surface having a low affinity for the oligothiophene or a derivative thereof;

discharging a solution containing a film forming material including at least oligothiophene or a derivative thereof, dissolved in a solvent to thereby apply a droplet of the solution to the surface of the substrate so as to form a droplet to cover the overall first area; and evaporating the solvent from the droplet to thereby form a film on the first area of the substrate as affected by the high affinity of the first area for the film forming material.

13. The method for forming a film according to claim 12, further comprising forming a self-assembled film on the substrate to thereby enable the substrate to have a surface with affinity for the film forming material.

14. The method for forming a film according to claim 13, further comprising forming the self-assembled film with a molecule that has an atomic group in common with a molecule constituting the film forming material.

15. The method for forming a film according to claim 14, further comprising: forming the film forming material with an oligothiophene or a derivative thereof, and forming the self-assembled film with a molecule that has a thiophene ring at its end or in part.

16. The method for forming a film according to claim 12, further including: forming a first self-assembled film on the substrate to thereby form the first area, the first self-assembled film including a molecule having an atomic group in common with the molecule constituting the film forming material, and forming a second self-assembled film on the substrate to thereby form the second area, the second self-assembled film including a molecule different from that of the first self-assembled film.

17. A method for forming an electronic device, comprising:

forming a film according to the method of claim 12.

* * * * *